(12) United States Patent
Kwon et al.

(10) Patent No.: US 12,721,010 B2
(45) Date of Patent: Aug. 25, 2026

(54) METHOD OF MANUFACTURING DISPLAY DEVICE INCLUDING FIRST AND SECOND PROTECTIVE LAYERS

(71) Applicant: Samsung Display Co., Ltd., Yongin-Si (KR)

(72) Inventors: Hyo Jeong Kwon, Yongin-si (KR); Seung Wook Kwon, Yongin-si (KR); Hee Chang Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 449 days.

(21) Appl. No.: 18/516,342

(22) Filed: Nov. 21, 2023

(65) Prior Publication Data

US 2024/0373671 A1 Nov. 7, 2024

(30) Foreign Application Priority Data

May 3, 2023 (KR) ........................ 10-2023-0057879

(51) Int. Cl.
*H10K 59/80* (2023.01)
*H10K 50/844* (2023.01)
*H10K 59/12* (2023.01)

(52) U.S. Cl.
CPC ....... *H10K 59/873* (2023.02); *H10K 50/8445* (2023.02); *H10K 59/1201* (2023.02)

(58) Field of Classification Search
CPC ............. H10K 50/844; H10K 50/8445; H10K 50/858; H10K 50/868; H10K 59/12; H10K 59/1201; H10K 59/126; H10K 59/873; H10K 59/8731; H10K 59/879; H10K 59/90; H10K 59/95; H10K 71/00; H10K 71/12; H10K 71/13; H10K 71/135; H10K 71/40; H10K 77/00; H10K 2102/351
See application file for complete search history.

(56) References Cited

U.S. PATENT DOCUMENTS 9,385,331 B2 * 7/2016 Jang ..................... H10K 77/111
10,800,936 B2 10/2020 Landa et al.

FOREIGN PATENT DOCUMENTS

KR 10-1402747 B1 6/2014

* cited by examiner

*Primary Examiner* — Cheung Lee
(74) *Attorney, Agent, or Firm* — Innovation Counsel LLP

(57) ABSTRACT

A method of manufacturing a display device is disclosed that includes sequentially forming a display panel and an encapsulation layer on a first surface of a substrate; forming a first protective layer covering the encapsulation layer, forming a second protective layer covering the first protective layer; forming a first film on the first surface of the substrate; removing a second surface of the substrate facing the first surface; removing the first film and the second protective layer; and after removing the first film and the second protective layer, removing the first protective layer.

20 Claims, 18 Drawing Sheets

MSUB
TFE
PNL
DP
DA
PA
SF1
H
SF2
DR2
DR3
DR1

FIG. 6A

MSUB
PNL
TFE
RF1
200
201
R1
UV
300
SF1
SF2
DR2
DR3
DR1

FIG. 6B

MSUB
PNL
TFE
RF1
200
201
R1
DA
UV
PA
300
SF1
SF2
DR2
DR3
DR1

RF1
TFE
PNL
MSUB
SF1
SF2
DR2
DR3
DR1

FIG. 8A

FIG. 8B 200
202
R2
300
UV
DA
PA
RF2
RF1
TFE
PNL
MSUB
SF1
SF2
DR1
DR2
DR3

FIG. 9

MSUB
RF2
RF1
TFE
PNL
400
SF1
SF2
DR2
DR3
DR1

METHOD OF MANUFACTURING DISPLAY DEVICE INCLUDING FIRST AND SECOND PROTECTIVE LAYERS

CROSS-REFERENCE TO RELATED APPLICATION

The application claims priority to and the benefit of Korean Patent Application No. 10-2023-0057879, filed May 3, 2023, which is hereby incorporated by reference for all purposes as if fully set forth herein.

BACKGROUND

Field

The present disclosure relates to a method of manufacturing a display device.

Discussion

As the information society develops, demands for display devices for displaying images are increasing in various forms. For example, the display devices are applied to various electronic devices such as smart phones, digital cameras, notebook computers, navigation devices, and smart televisions.

In addition, in order to enhance the portability of the display devices, there is a trend towards thinner and lighter devices. Accordingly, technology development for making display device components thinner and lighter is being actively conducted.

SUMMARY

Embodiments of the present disclosure may provide a method of manufacturing a display device, which includes preventing a protective film disposed on a substrate from being removed together with an acid-resistant film in a process of peeling the acid-resistant film after etching the substrate.

In addition, embodiments of the present disclosure may provide a method of manufacturing a display device, which includes preventing foreign substances from entering an outer portion of the substrate and preventing the substrate from being damaged by scratches or the like.

An embodiment of a method of manufacturing a display device may include sequentially forming a display panel and an encapsulation layer on a first surface of a substrate; forming a first protective layer covering the encapsulation layer; forming a second protective layer covering the first protective layer; forming a first film on the first surface of the substrate; removing a second surface of the substrate facing the first surface; removing the first film and the second protective layer; and, after removing the first film and the second protective layer, removing the first protective layer.

In an embodiment, the forming the first protective layer may include spraying a first resin material through a nozzle of an inkjet printing device; curing the first resin material with ultraviolet light; and supplying plasma to the first resin material.

In an embodiment, the forming the second protective layer may include spraying a second resin material through the nozzle of the inkjet printing device; and curing the second resin material with ultraviolet light.

In an embodiment, the first protective layer may have a first peeling force, and the second protective layer may have a second peeling force different from the first peeling force. The first peeling force may be greater than the second peeling force.

In an embodiment, the first film may have a third peeling force smaller than the second peeling force.

In an embodiment, the first resin material and the second resin material may include the same ultraviolet curable resin material, in the curing the first resin material with the ultraviolet light, the first resin material may be cured with the ultraviolet light for a first time period, and in the curing the second resin material with the ultraviolet light, the second resin material may be cured with the ultraviolet light for a second time period shorter than the first time period.

In an embodiment, the first resin material and the second resin material may include an ultraviolet curable resin, the ultraviolet curable resin may include a plurality of monomers and oligomers, and the number of oligomers included in the first resin material may be greater than the number of oligomers included in the second resin material.

In an embodiment, the forming the second protective layer may further include supplying plasma to the second resin material.

In an embodiment, a spray angle of the nozzle of the inkjet printing device may be about 45° to 135°.

In an embodiment, the spraying the first resin material and the curing the first resin material with the ultraviolet light may be performed simultaneously, and the spraying the second resin material and the curing the second resin material with the ultraviolet light may be performed simultaneously.

In an embodiment, in the removing the second surface of the substrate, the substrate may be etched using an etchant.

In an embodiment, a thickness of the substrate including the first surface and the second surface may be about 500 μm, and the thickness of the substrate from which the second surface is removed may be about 200 μm.

In an embodiment, the first film may be an acid-resistant film.

In an embodiment, the first film may include a PET (polyethylene terephthalate) film.

In an embodiment, a thickness of the first protective layer may be about 100 μm, and a thickness of the second protective layer may be about 10 μm to 30 μm.

In an embodiment, the method of manufacturing the display device may further include disposing an adhesive layer covering the first surface of the substrate and the second protective layer, and in the forming the first film, the first film may be formed on the adhesive layer.

In an embodiment, the method of manufacturing the display device may further include removing the second protective layer, and the second protective layer may be removed simultaneously with the first film.

In an embodiment, the method of manufacturing the display device may further include removing the first protective layer; and disposing a polarizing plate on the encapsulation layer, and the first protective layer may be removed before the polarizing plate is disposed.

In an embodiment, the first surface of the substrate may include a display area and a peripheral area located on at least one side of the display area, and at least a portion of the peripheral area may not be covered by the first protective layer.

In an embodiment, the second protective layer may entirely cover the display area and the peripheral area.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 5A, 5B, 6A, 6B, 7, 8A, 8B, 9, 10, 11, 12, 13, and 14 are cross-sectional views schematically illustrating a method of manufacturing a display device according to embodiments of the present disclosure.

DETAILED DESCRIPTION OF THE ILLUSTRATED EMBODIMENTS

Figure 1:
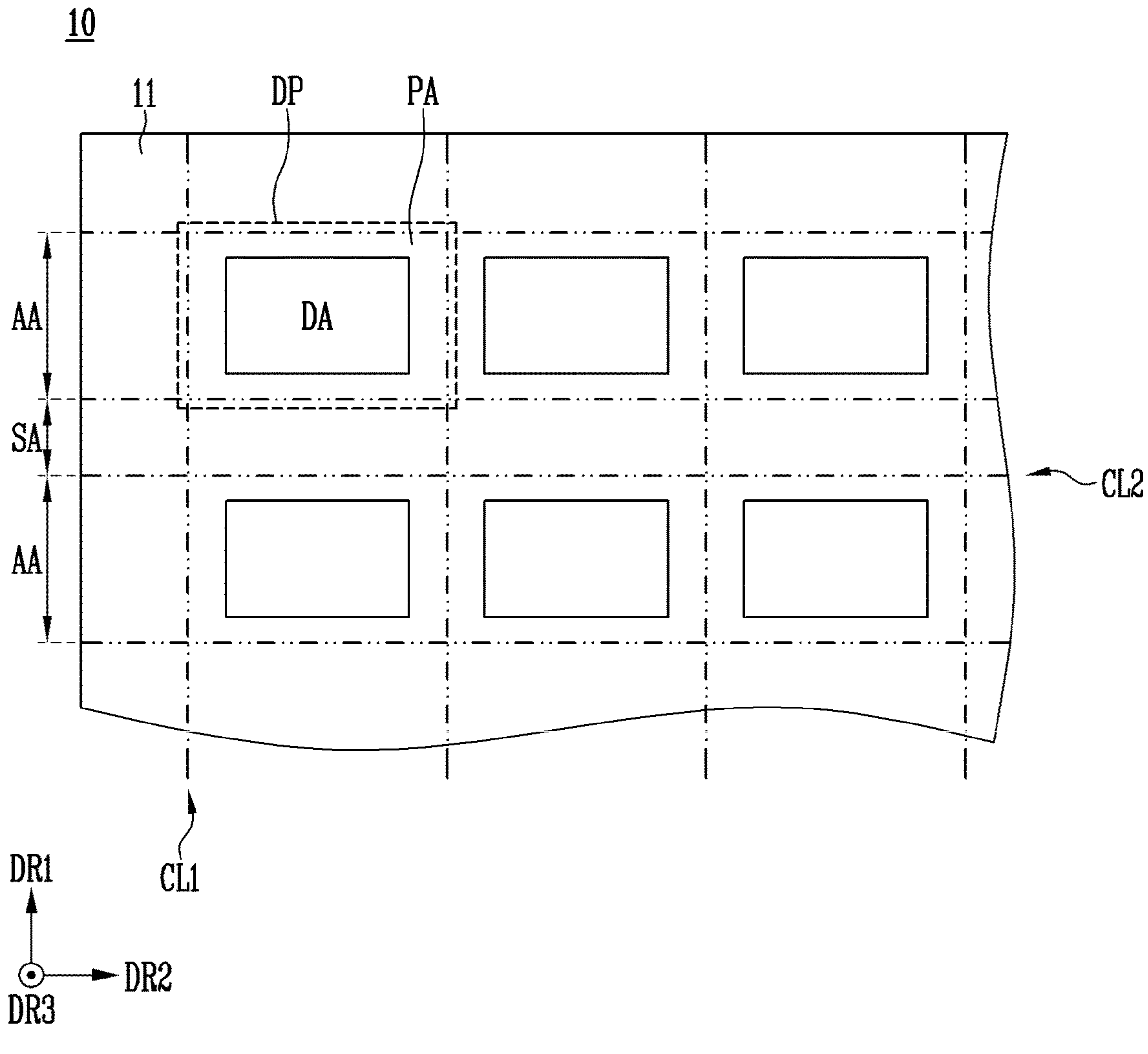
FIG. 1 is a plan view illustrating a mother substrate for a display substrate according to an embodiment of the present disclosure.

Hereinafter, preferred embodiments will be described in more detail with reference to the accompanying drawings. The same reference numerals are used for the same elements in the drawings, and duplicate descriptions of the same elements are omitted.

FIG. 1 is a plan view illustrating a mother substrate for a display substrate according to an embodiment.

Referring to FIG. 1, a base substrate 11 of a mother substrate 10 for a display substrate may include a plurality of array areas AA and an outer area SA between adjacent array areas AA. Each array area AA may include a display area DA for displaying an image and a peripheral area PA located on one side of the display area DA.

Each array area AA of the base substrate 11 may be formed as one display substrate DP through a cutting process of cutting the base substrate 11 into unit array areas AA. In the base substrate 11, a cutting line extending in a first direction DR1 may be defined as a first cutting line CL1, and a cutting line extending in a second direction DR2 crossing the first direction DR1 may be defined as a second cutting line CL2. The first and second cutting lines CL1 and CL2 may correspond to virtual lines for cutting the mother substrate 10 for the display substrate in the cutting process.

An alignment mark (not shown) may be formed in the outer area SA of the base substrate 11. The alignment mark may be used to monitor the overlay of each layer on the display substrate DP. The alignment mark may be formed one by one per cell in the outer area SA of the base substrate 11, but the alignment mark is not limited thereto. The number of alignment marks may be appropriately changed according to the size of the base substrate 11 and the size and number of cells to be formed.

Figure 2A:
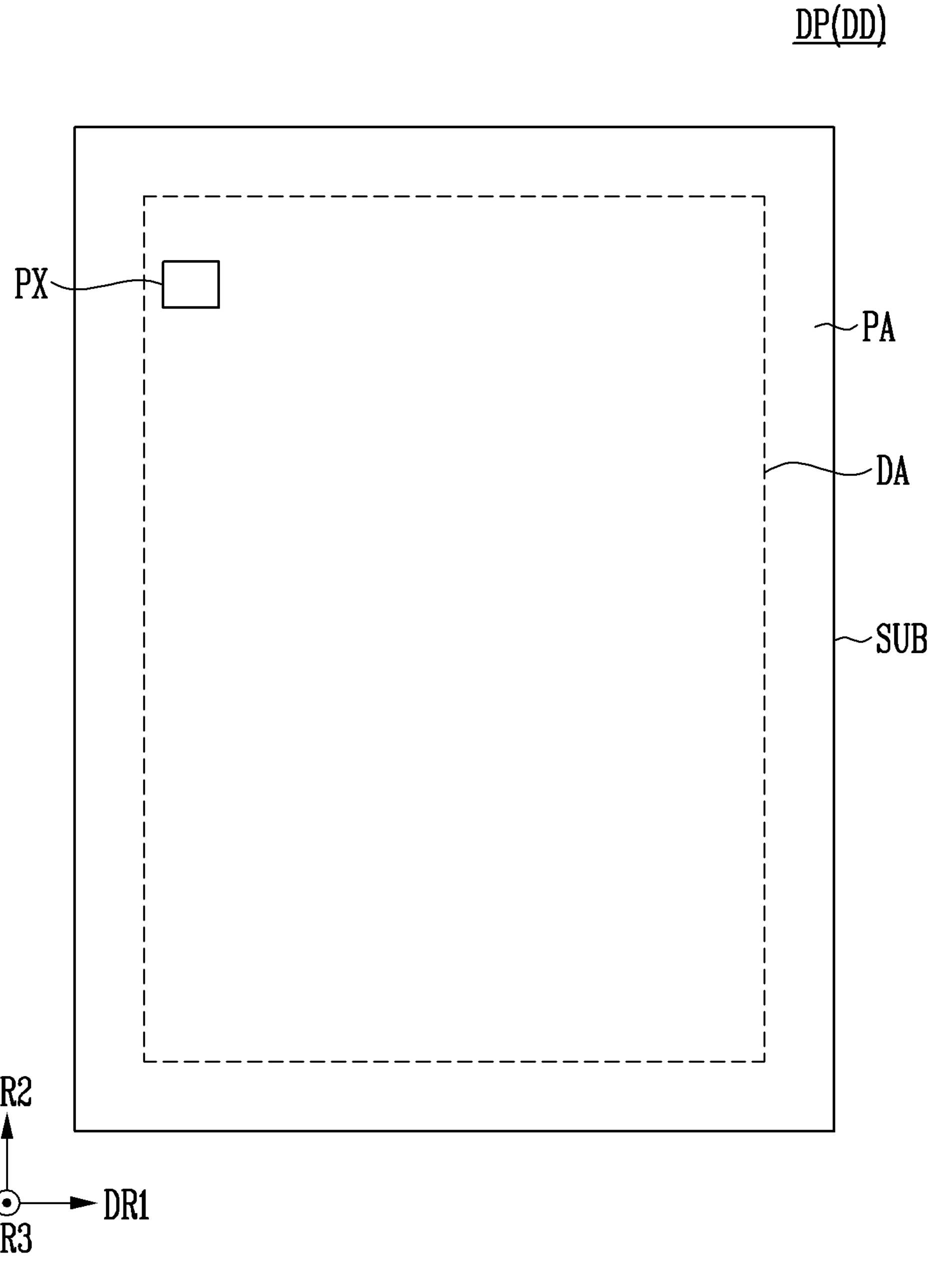
FIG. 2A is a plan view illustrating an embodiment of the display substrate of FIG. 1.
Figure 2B:
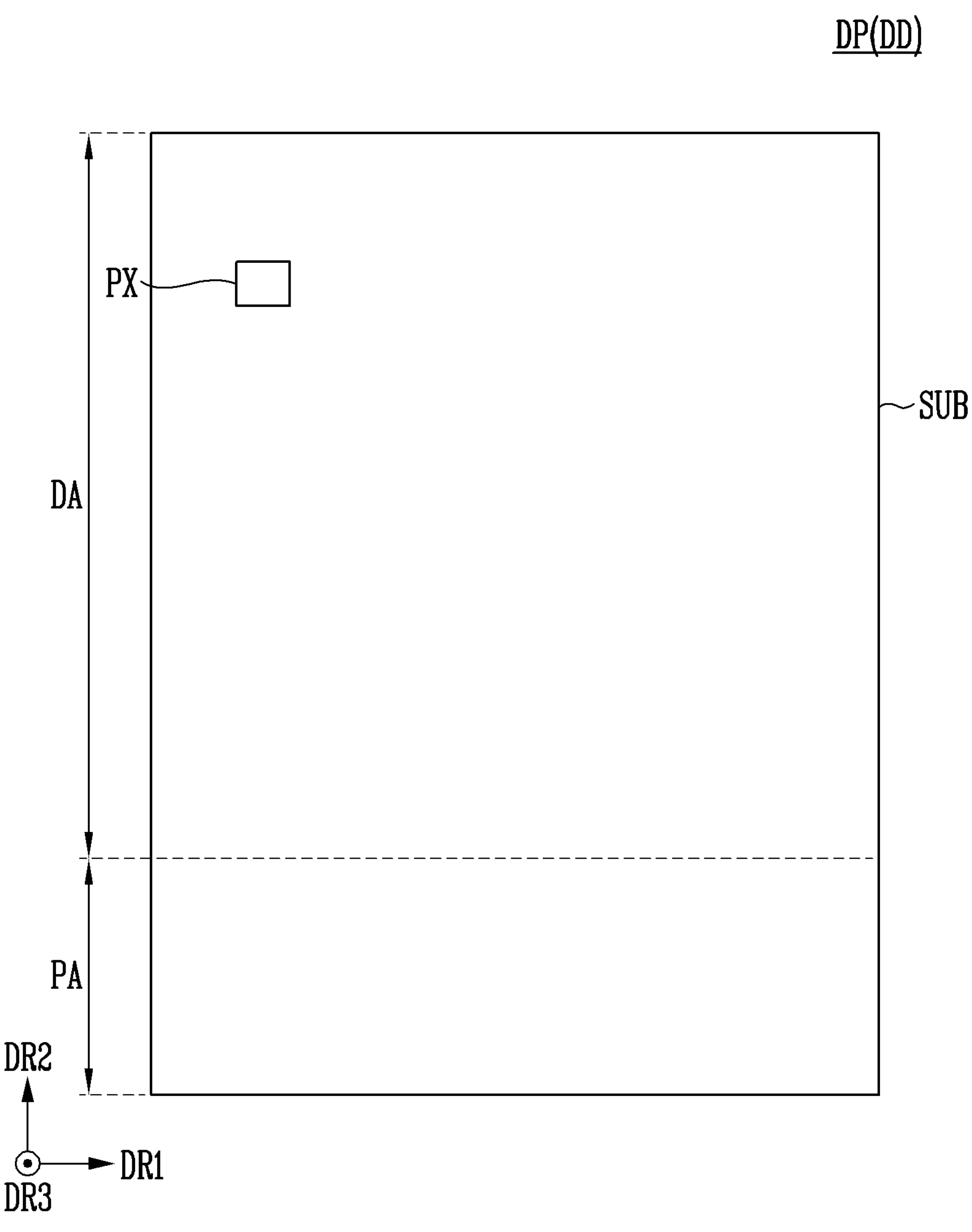
FIG. 2B is a plan view illustrating another embodiment of the display substrate of FIG. 1.

FIG. 2A is a plan view illustrating an embodiment of the display substrate of FIG. 1. FIG. 2B is a plan view illustrating another embodiment of the display substrate of FIG. 1.

Referring to FIGS. 1, 2A, and 2B, the display substrate DP may be one area of the base substrate 11 corresponding to each array area AA.

Referring to FIGS. 2A and 2B, a display device DD may include the display substrate DP. The display substrate DP may be provided in various shapes. As an example, the display substrate DP may be provided in the shape of a rectangular plate having two pairs of sides parallel to each other, but the display substrate DP is not limited thereto. When the display substrate DP is provided in a rectangular plate shape, one pair of sides of the two pairs of sides may be provided longer than the other pair of sides.

The display substrate DP may have various shapes. As an example, the display substrate DP may be provided in a rectangular shape, but the display substrate DP is not limited thereto. For example, the display substrate DP may have a circular or elliptical shape. Also, the display substrate DP may include angled corners or curved corners. For convenience of description, FIGS. 2A and 2B show an embodiment in which the display substrate DP has a rectangular plate shape. In addition, in FIGS. 2A and 2B, the direction (for example, the horizontal direction) in which the short side of the display substrate DP extends is indicated as the first direction DR1, and the direction (for example, the vertical direction) in which the long side extends is indicated as the second direction DR2.

Figure 4:
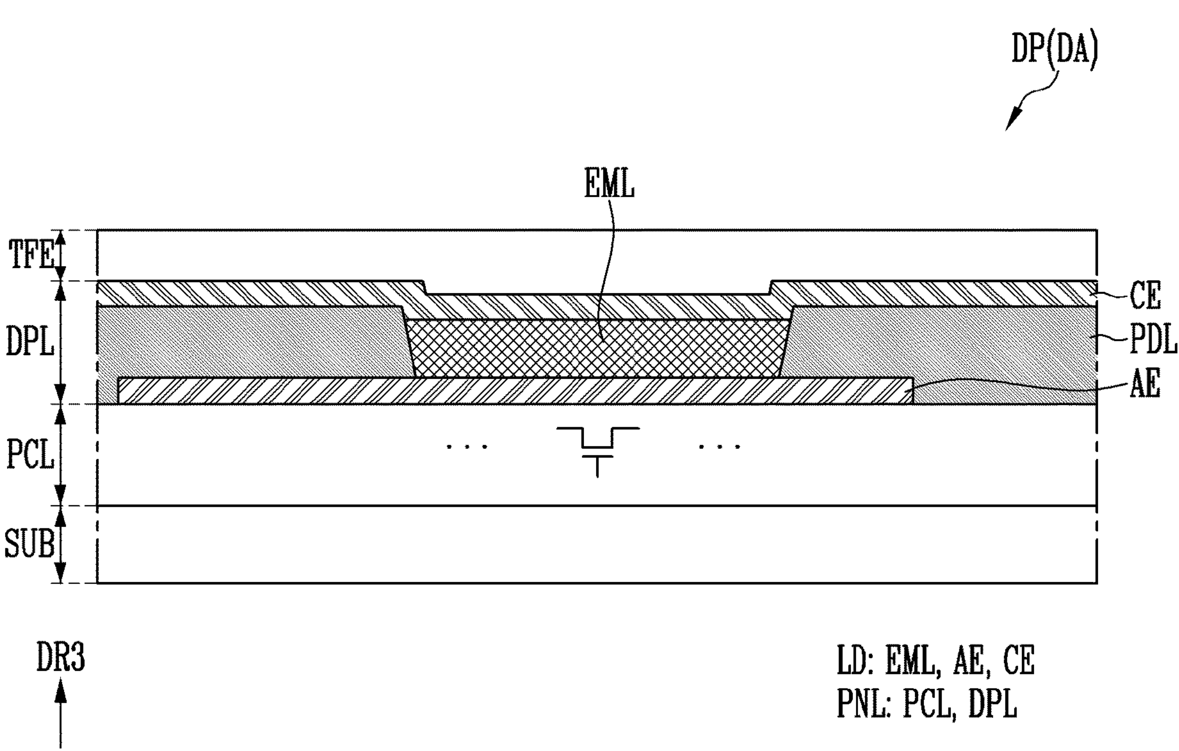
FIG. 4 is a cross-sectional view schematically illustrating the display substrate including a light emitting element of FIG. 3.

The display substrate DP may include a display panel (for example, the display panel PNL of FIG. 4). In one example, as the display panel, a display panel capable of self-emitting light such as an organic light emitting display panel (OLED panel) using an organic light emitting diode as a light emitting element, a micro-LED (or nano-LED) display panel using a micro light emitting diode as a light emitting element, and a quantum dot organic light emitting display panel (QD OLED panel) using quantum dots and organic light emitting diodes may be used. Also, as the display panel, a non-emitting light display panel such as a liquid crystal display panel (LCD panel), an electro-phoretic display panel (EPD panel), and an electro-wetting display panel (EWD panel) may be used. Hereinafter, a case in which the display substrate DP includes an organic light emitting display panel will be described as an example.

The display substrate DP may include a substrate SUB and a plurality of pixels PX provided on the substrate SUB.

The substrate SUB may include a transparent insulating material to transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate including a polymeric organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The display substrate DP may include the display area DA and the peripheral area PA. The display area DA may be an area in which a plurality of pixels PX are formed to display an image. Each pixel PX may include a pixel circuit connected to a plurality of signal lines and an organic light emitting element whose light emitting is controlled by the pixel circuit. The peripheral area PA may be an area excluding the display area DA and may be a non-display area. The peripheral area PA may have a structure for protecting components included in the pixels PX disposed in the display area DA, but the peripheral area PA is not limited thereto. For example, a wiring unit connected to each pixel PX and a driving unit connected to the wiring unit to drive the pixel PX may be provided in the peripheral area PA.

Referring to FIG. 2A, the peripheral area PA may surround the periphery (or edge) of the display area DA. Referring to FIG. 2B, the peripheral area PA may be provided on at least one side of the display area DA.

Referring to FIG. 2B, when the display substrate DP is applied to a rollable display device, the display substrate DP may include a flexible material that can be easily bent, folded, or rolled. In this case, at least one area of the display area DA and the peripheral area PA may include a bending area.

Figure 3:
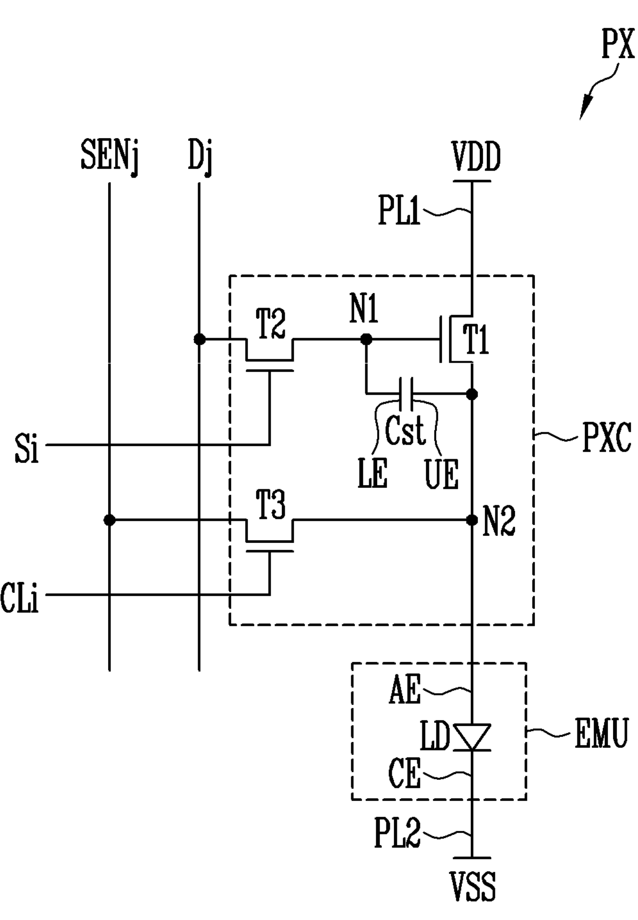
FIG. 3 is a circuit diagram schematically illustrating pixels of FIGS. 2A and 2B.

FIG. 3 is a circuit diagram schematically illustrating pixels of FIGS. 2A and 2B.

In FIG. 3, for convenience of description, a pixel PX positioned in an i-th pixel row (or i-th horizontal line) and a j-th pixel column is shown as an example, where i and j may be natural numbers.

Referring to FIG. 3, the pixel PX may include an emission unit EMU that generates light having a luminance corresponding to a data signal. Also, the pixel PX may further include a pixel circuit PXC for driving the emission unit EMU.

The emission unit EMU may include a light emitting element LD connected between a first power source line PL1 receiving a voltage of a first driving power source VDD (or first power source) and a second power source line PL2 receiving a voltage of a second driving power source VSS (or second power source). As an example, the emission unit EMU may include the pixel circuit PXC and the light emitting element LD including a first electrode AE connected to the first driving power source VDD via the first power source line PL1 and a second electrode CE connected to the second driving power source VSS via the second power source line PL2. The first electrode AE may be an anode, and the second electrode CE may be a cathode. The first driving power source VDD and the second driving power source VSS may have different potentials. In this case, a potential difference between the first and second driving power sources VDD and VSS may be set to be higher than or equal to a threshold voltage of the light emitting element LD during an emission period of the pixel PX.

When the pixel PX is positioned in the i-th pixel row and the j-th pixel column in the display area DA, the pixel circuit PXC of the pixel PX (or sub-pixel) may be electrically connected to an i-th scan line Si and a j-th data line Dj. Also, the pixel circuit PXC may be electrically connected to an i-th control line CLi and a j-th sensing line SENj.

The pixel circuit PXC may include first to third transistors T1, T2, and T3 and a storage capacitor Cst.

The first transistor T1 may be a driving transistor for controlling a driving current applied to the light emitting element LD, and may be electrically connected between the first driving power source VDD and the light emitting element LD. Specifically, a first terminal of the first transistor T1 may be electrically connected to the first driving power source VDD through the first power source line PL1, a second terminal of the first transistor T1 may be electrically connected to a second node N2, and a gate electrode of the first transistor T1 may be electrically connected to a first node N1. The first transistor T1 may control the amount of driving current applied from the first driving power source VDD to the light emitting element LD through the second node N2 according to a voltage applied to the first node N1. In an embodiment, the first terminal of the first transistor T1 may be a drain electrode, and the second terminal of the first transistor T1 may be a source electrode, but the first transistor T1 is not limited thereto. According to an embodiment, the first terminal may be a source electrode and the second terminal may be a drain electrode.

The second transistor T2 may be a switching transistor that selects the pixel PX in response to a scan signal and activates the pixel PX, and may be electrically connected between a data line Dj (for example, the j-th data line) and the first node N1. A first terminal of the second transistor T2 may be electrically connected to the data line Dj, a second terminal of the second transistor T2 may be connected to the first node N1 (or the gate electrode of the first transistor T1), and a gate electrode of the second transistor T2 may be electrically connected to a scan line Si (or the i-th scan line). The first terminal and the second terminal of the second transistor T2 may be different terminals. For example, when the first terminal is a drain electrode, the second terminal may be a source electrode.

The second transistor T2 may be turned on when the scan signal of a gate-on voltage (for example, a high level voltage) is supplied from the scan line Si to electrically connect the data line Dj and the first node N1. The first node N1 may be a point where the second terminal of the second transistor T2 and the gate electrode of the first transistor T1 are connected, and the second transistor T2 may transmit a data signal to the gate electrode of the first transistor T1.

The third transistor T3 may obtain a sensing signal through a sensing line SENj by electrically connecting the first transistor T1 to the sensing line SENj (for example, the j-th sensing line), and may detect characteristics of the pixel PX, such as a threshold voltage of the first transistor T1, by using the sensing signal. Information on the characteristics of the pixel PX may be used to convert image data so that a deviation in characteristics between the pixels PX can be compensated for. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to a control line CLi (for example, the i-th control line). The first terminal may be a drain electrode, and the second terminal may be a source electrode.

The third transistor T3 may be an initialization transistor capable of initializing the second node N2, and may be turned on when a sensing control signal is supplied from the control line CLi to transfer a voltage of an initialization power source to the second node N2. Accordingly, the storage capacitor Cst electrically connected to the second node N2 may be initialized.

The storage capacitor Cst may include a lower electrode LE (or first storage electrode) and an upper electrode UE (or second storage electrode). The lower electrode LE may be electrically connected to the first node N1 and the upper electrode UE may be electrically connected to the second node N2. The storage capacitor Cst may be charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

FIG. 3 shows an embodiment in which all of the first to third transistors T1 to T3 are N-type transistors, but the first to third transistors T1 to T3 are not limited thereto. For example, at least one of the first to third transistors T1, T2, and T3 may be changed to a P-type transistor. A structure of the pixel circuit PXC may be variously changed and implemented.

FIG. 4 is a cross-sectional view schematically illustrating the display substrate including a light emitting element of FIG. 3.

The display substrate DP (or display device) may include the substrate SUB, the display panel PNL disposed on the substrate SUB, and an encapsulation layer TFE.

The substrate SUB may be a substrate disposed in the display device after a base substrate (for example, the base substrate 11 of FIG. 1) undergoes chemical/physical processing in a manufacturing process of the display device.

The display panel PNL may include a pixel circuit layer PCL and a display element layer DPL.

The pixel circuit layer PCL may be provided on the substrate SUB and may include a plurality of transistors and signal lines connected to the transistors. For example, each transistor may have a form in which a semiconductor pattern, a gate electrode, a source electrode, and a drain electrode are sequentially stacked with insulating layers interposed therebetween. The semiconductor pattern may include amorphous silicon, poly silicon, low temperature poly silicon, an organic semiconductor, or an oxide semiconductor. The gate electrode, the source electrode, and the drain electrode may include one of aluminum (Al), copper (Cu), titanium (Ti), and molybdenum (Mo), but they are not limited thereto. Also, the pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but the light emitting element is not limited thereto. According to an embodiment, the light emitting element may be an inorganic light emitting device including an inorganic light emitting material or a light emitting element that emits light by changing a wavelength of light emitted using quantum dots. In this specification, for convenience of description, an embodiment in which light emitting elements LD are organic light emitting diodes (OLED) will be described as an example.

The encapsulation layer TFE may be disposed on the display element layer DPL. The encapsulation layer TFE may be an encapsulation substrate or may have a form of an encapsulation film made of a multilayer film. When the encapsulation layer TFE has a form of an encapsulation film, the encapsulation layer TFE may include an inorganic film or an organic film. For example, the encapsulation layer TFE may have a form in which an inorganic layer, an organic layer, and an inorganic layer are sequentially stacked. The encapsulation layer TFE may prevent air and moisture from penetrating into the display element layer DPL and the pixel circuit layer PCL from outside.

The light emitting element LD may be disposed on the pixel circuit layer PCL. According to an embodiment, the light emitting element LD may include a first electrode AE, a light emitting layer EML, and a second electrode CE. According to an embodiment, the light emitting layer EML may be disposed in an area defined by a pixel defining layer PDL. One surface of the light emitting layer EML may be electrically connected to the first electrode AE, and the other surface of the light emitting layer EML may be electrically connected to the second electrode CE.

The first electrode AE may be an anode electrode for the light emitting layer EML, and the second electrode CE may be a common electrode (or cathode electrode) for the light emitting layer EML. According to an embodiment, the first electrode AE and the second electrode CE may include a conductive material. For example, the first electrode AE may include a conductive material having a reflective property, and the second electrode CE may include a transparent conductive material, but the disclosure is not necessarily limited thereto.

The light emitting layer EML may have a multilayer thin film structure including a light generation layer. The light emitting layer EML may include a hole injection layer for injecting holes, a hole transport layer having excellent hole transport properties and suppressing the movement of electrons that are not combined in the light generation layer to increase recombination opportunities between holes and electrons, the light generation layer that emits light by recombination of injected electrons and holes, a hole blocking layer for suppressing the movement of holes that are not combined in the light generation layer, an electron transport layer for smoothly transporting electrons to the light generation layer, and an electron injection layer for injecting electrons. The light emitting layer EML may emit light based on electrical signals provided from the first electrode AE and the second electrode CE.

The pixel defining layer PDL may be disposed on the pixel circuit layer PCL to define a position where the light emitting layer EML is arranged. The pixel defining layer PDL may include an organic material. According to an embodiment, the pixel defining layer PDL may include at least one selected from a group consisting of an acrylic resin, an epoxy resin, a phenol resin, a polyamide resin, and a polyimide resin. However, the disclosure is not limited thereto.

The encapsulation layer TFE may be disposed on the light emitting element LD (for example, the second electrode CE). The encapsulation layer TFE may offset a step difference generated by the light emitting element LD and the pixel defining layer PDL. The encapsulation layer TFE may include a plurality of insulating films covering the light emitting element LD. A polarizing film (or color filter) (not shown) may be further disposed on the encapsulation layer TFE.

FIGS. 5A to 14 are cross-sectional views schematically illustrating a method of manufacturing a display device according to embodiments.

A display device (or display substrate) to be described with reference to FIGS. 5A to 14 may be manufactured using a mother substrate MSUB for a display substrate. However, for convenience of description, a method of manufacturing a display device will be described focusing on one cell (for example, one display substrate DP) on a base substrate SUB of the mother substrate MSUB for the display substrate.

Figure 11:
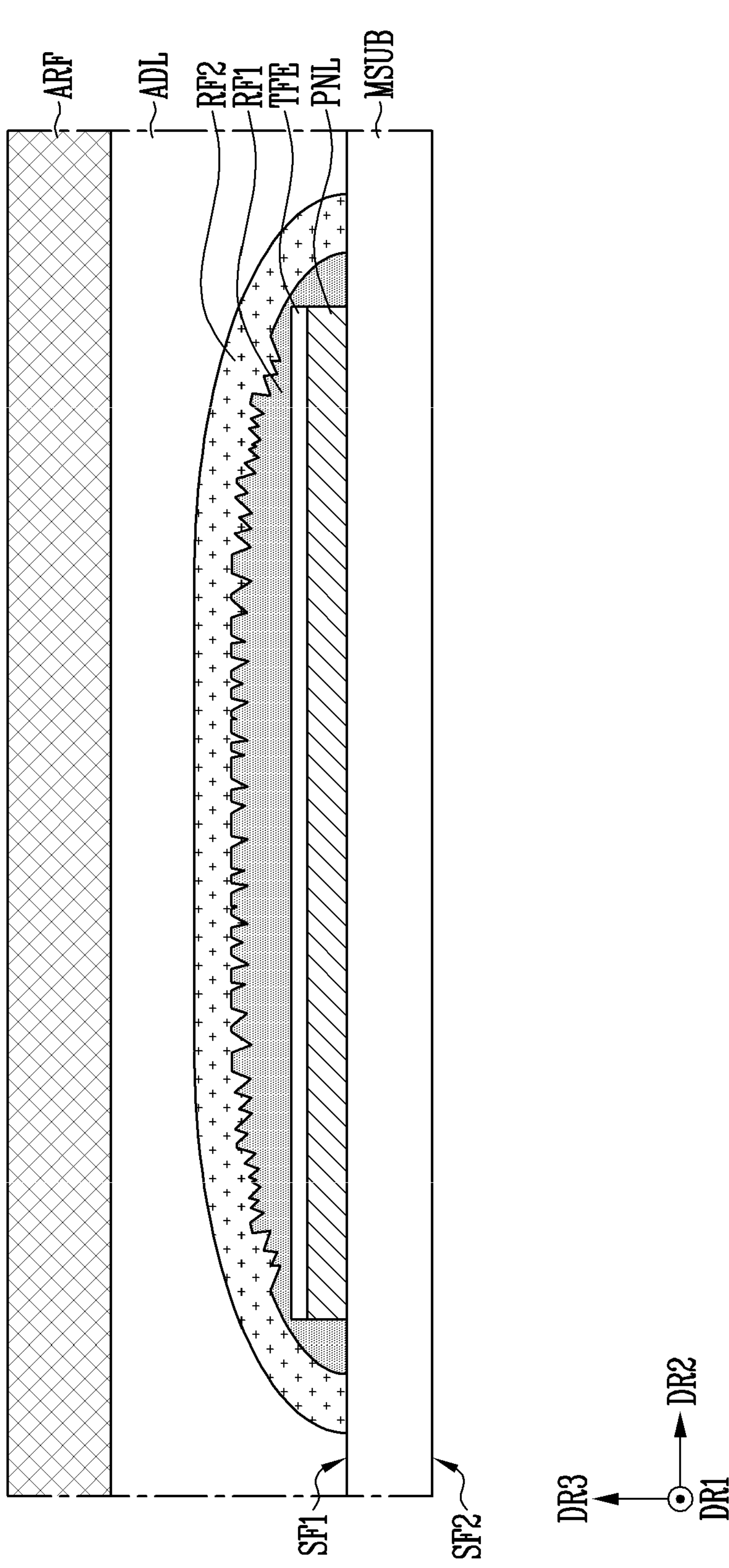
Figure 12:
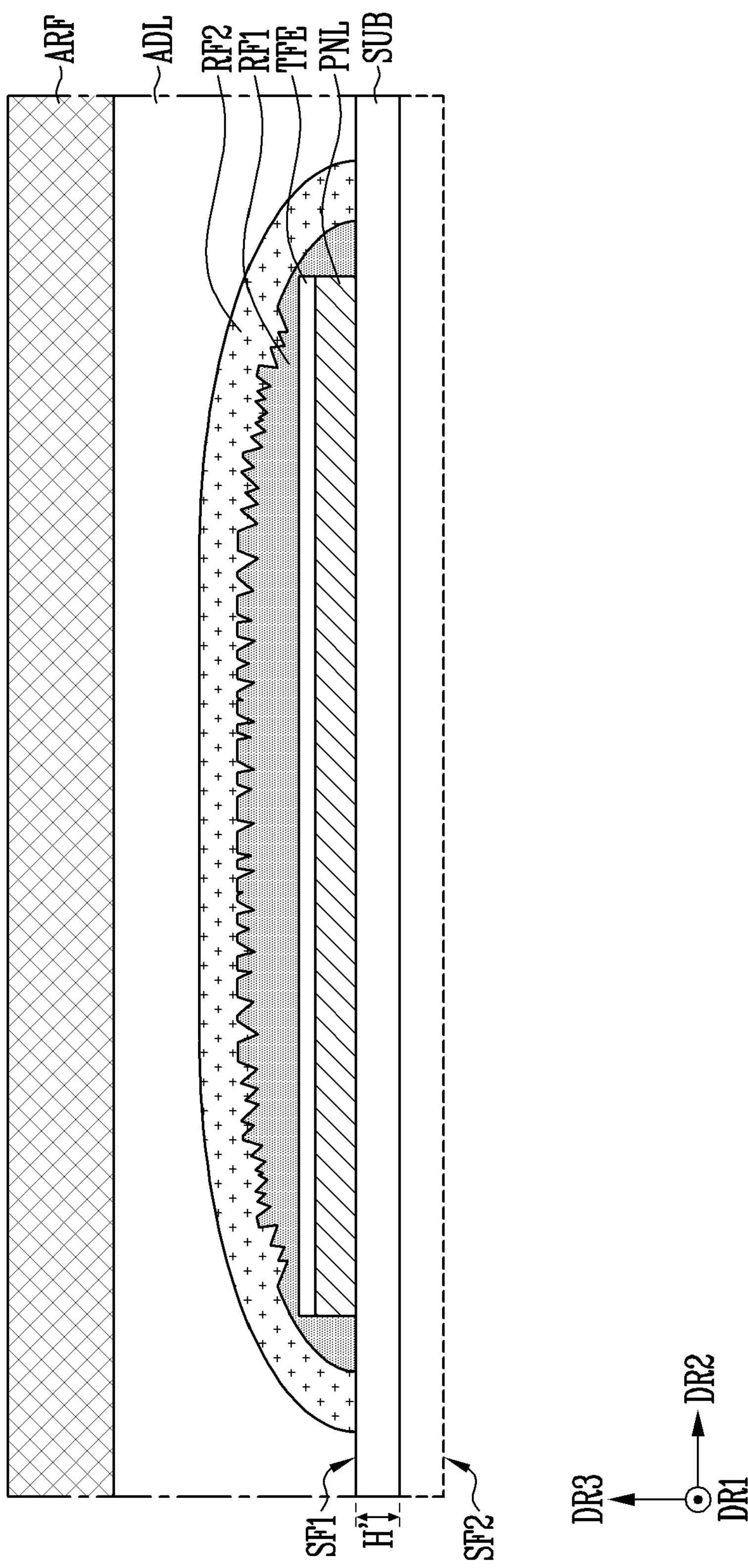
Figure 13:
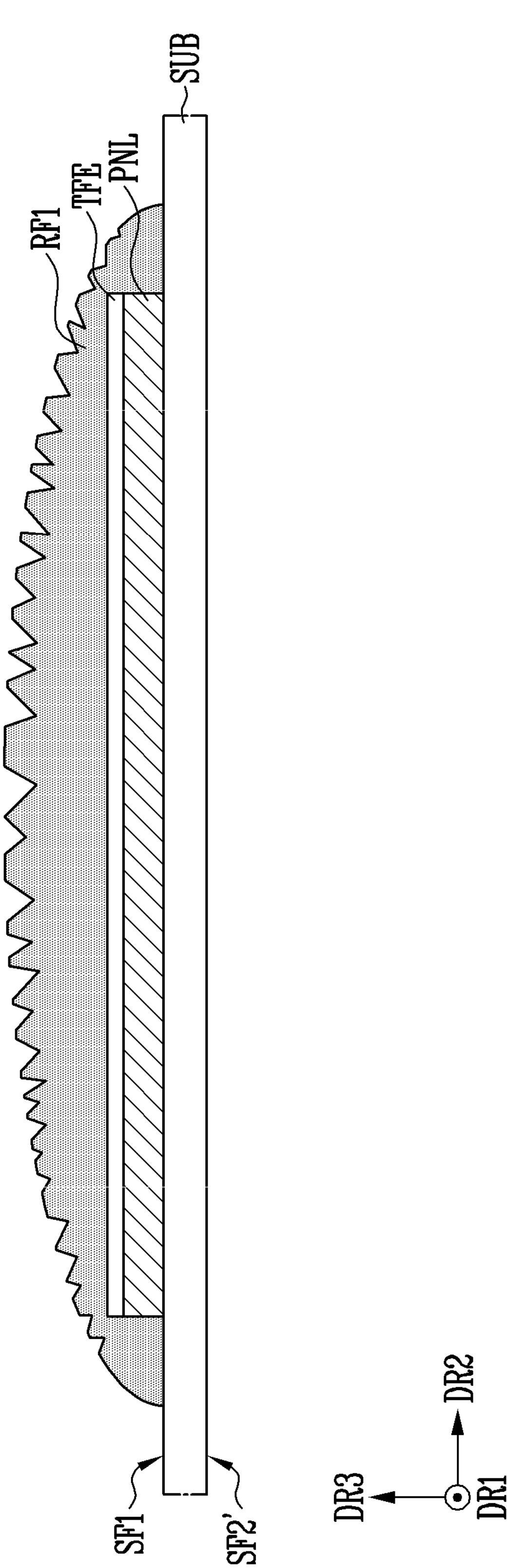

Referring to FIGS. 5A to 14, the method of manufacturing the display device may include sequentially forming a display panel PNL and an encapsulation layer TFE on a substrate MSUB (refer to FIGS. 5A and 5B), forming a first protective layer RF1 on the encapsulation layer TFE and covering the encapsulation layer TFE (refer to FIGS. 6A to 7), forming a second protective layer RF2 on the first protective layer RF1 and covering the first protective layer RF1 (refer to FIGS. 8A to 10), forming a first film ARF on a first surface SF1 of the substrate SUB (refer to FIG. 11), removing a second surface SF2 of the substrate SUB (refer to FIG. 12), and removing the first film ARF after removing the second surface SF2 of the substrate SUB (refer to FIG. 13). Also, the method of manufacturing the display device may further include removing the first protective layer RF1 before forming a polarizing plate POL on the encapsulation layer TFE (refer to FIG. 14).

Figure 5A:
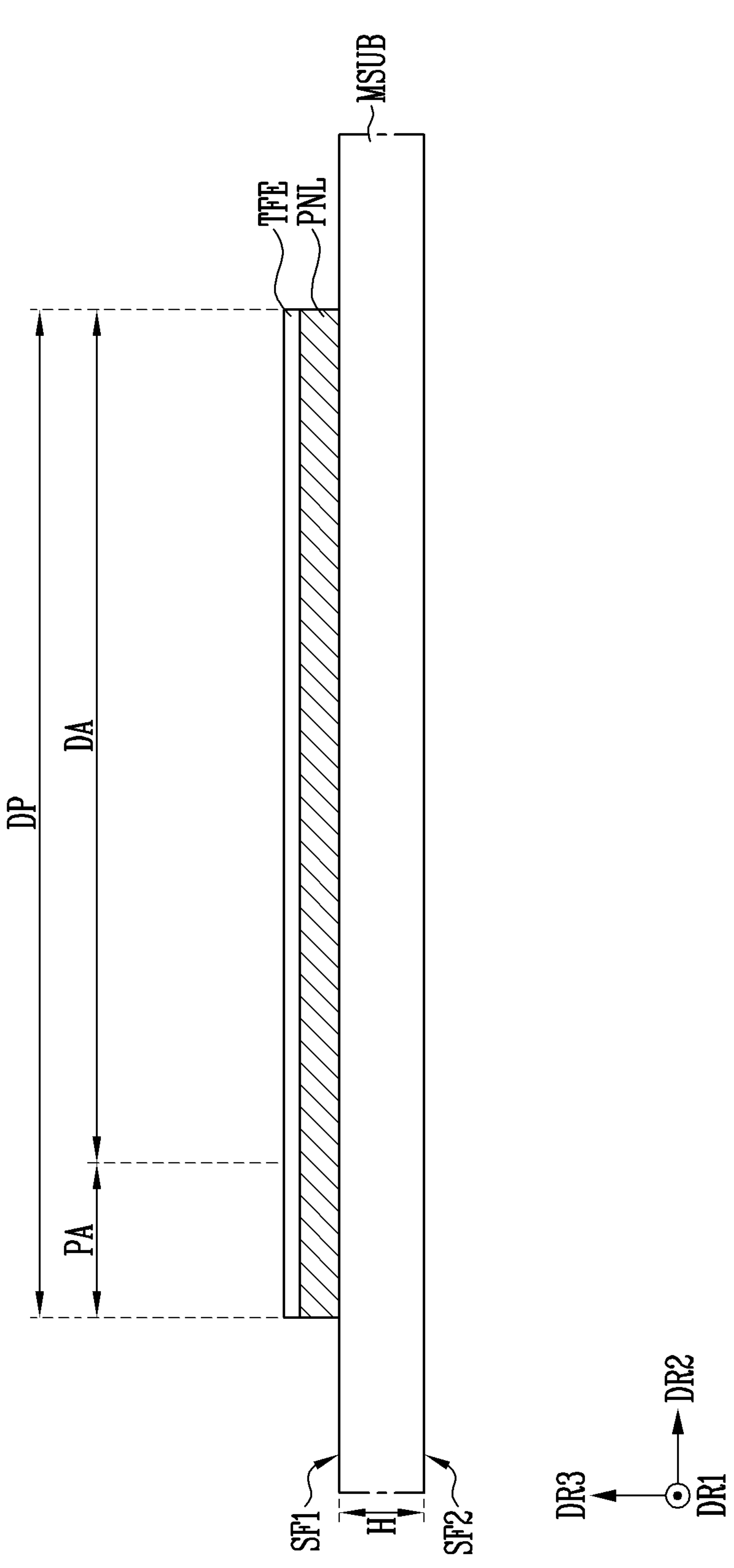
Figure 5B:
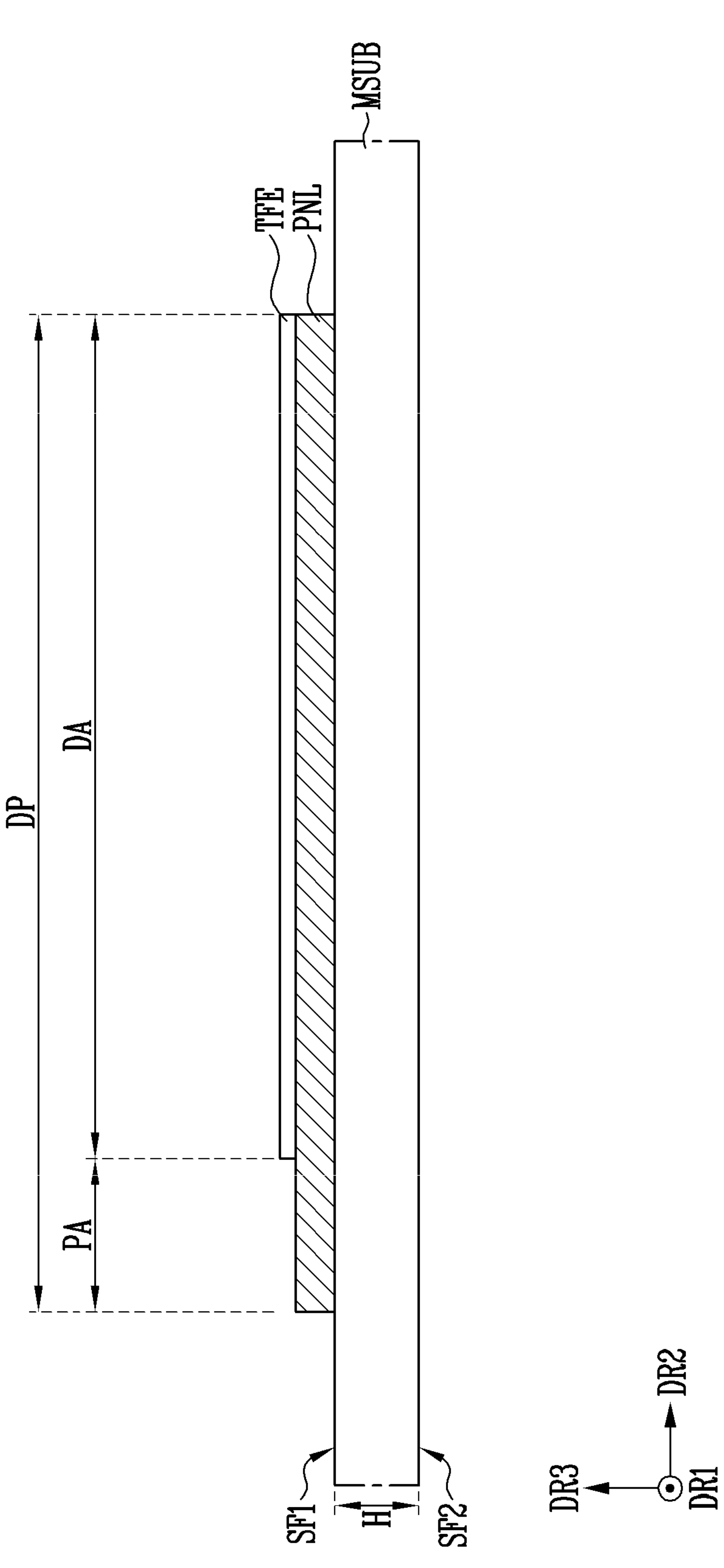

As shown in FIGS. 5A and 5B, the display panel PNL and the encapsulation layer TFE may be sequentially formed on the first surface SF1 of the substrate MSUB (or mother substrate) in a third direction DR3.

The substrate MSUB may be a mother substrate (for example, a portion of the base substrate 11 of FIG. 1) and may include a substrate before an etching process for the substrate MSUB is performed. The substrate MSUB may include the first surface SF1 and the second surface SF2 facing the first surface SF1.

In an embodiment, the first surface SF1 of the substrate MSUB may be a layer on which the display panel PNL and the encapsulation layer TFE are formed. The second surface SF2 of the substrate MSUB may include one surface on which the substrate MSUB is polished (etched) by a slimming process.

Referring to FIG. 5A, the display panel PNL and the encapsulation layer TFE may be disposed in a display area DA and a peripheral area PA. Some components of the encapsulation layer TFE and the display panel PNL disposed in the display area DA may be extended to and disposed in the peripheral area PA. Referring to FIG. 5B, the encapsulation layer TFE may be disposed only on the display panel PNL disposed in the display area DA. The display panel PNL disposed in the peripheral area PA may be exposed to the outside.

Figure 6A:
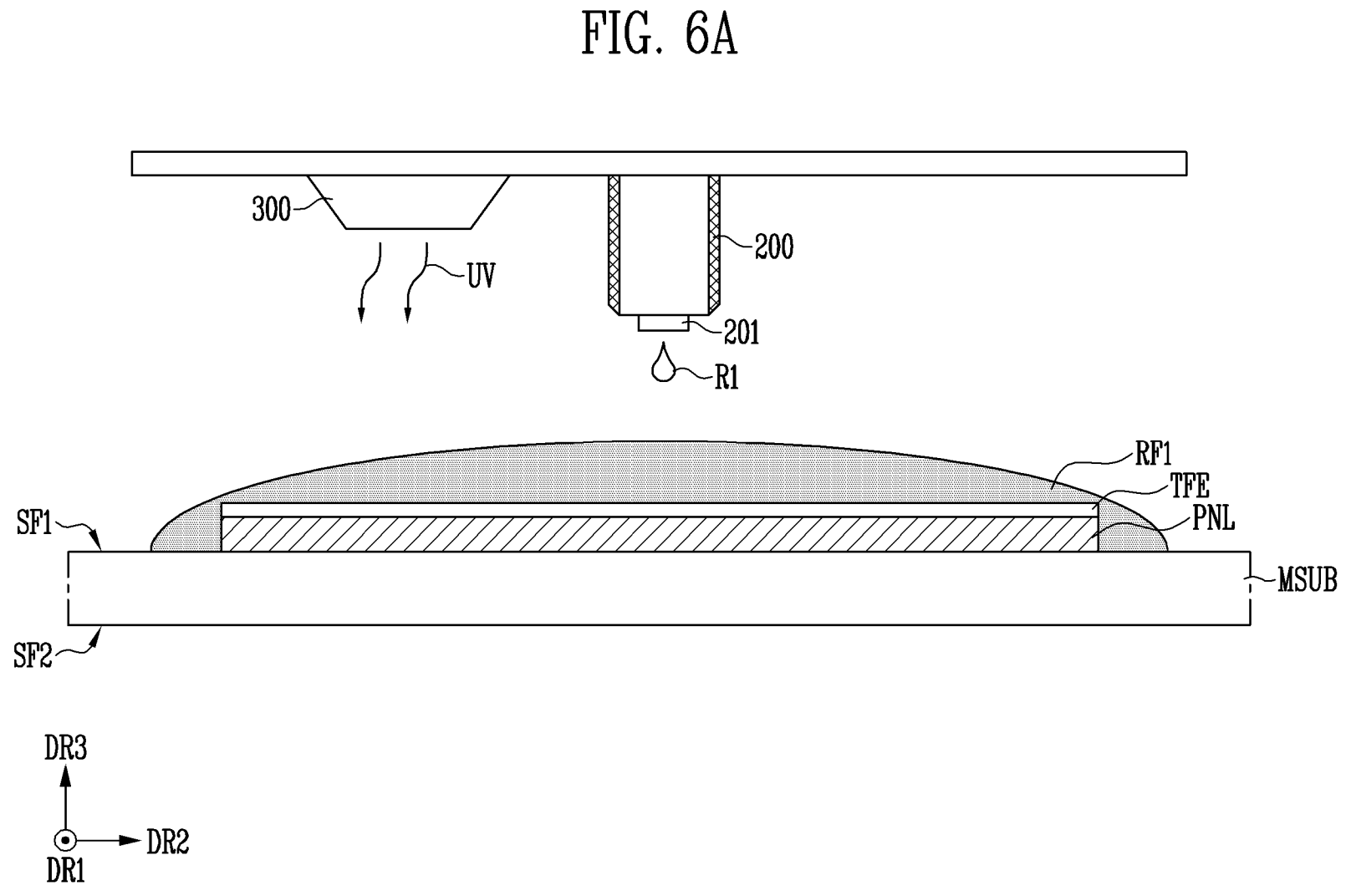
Figure 6B:
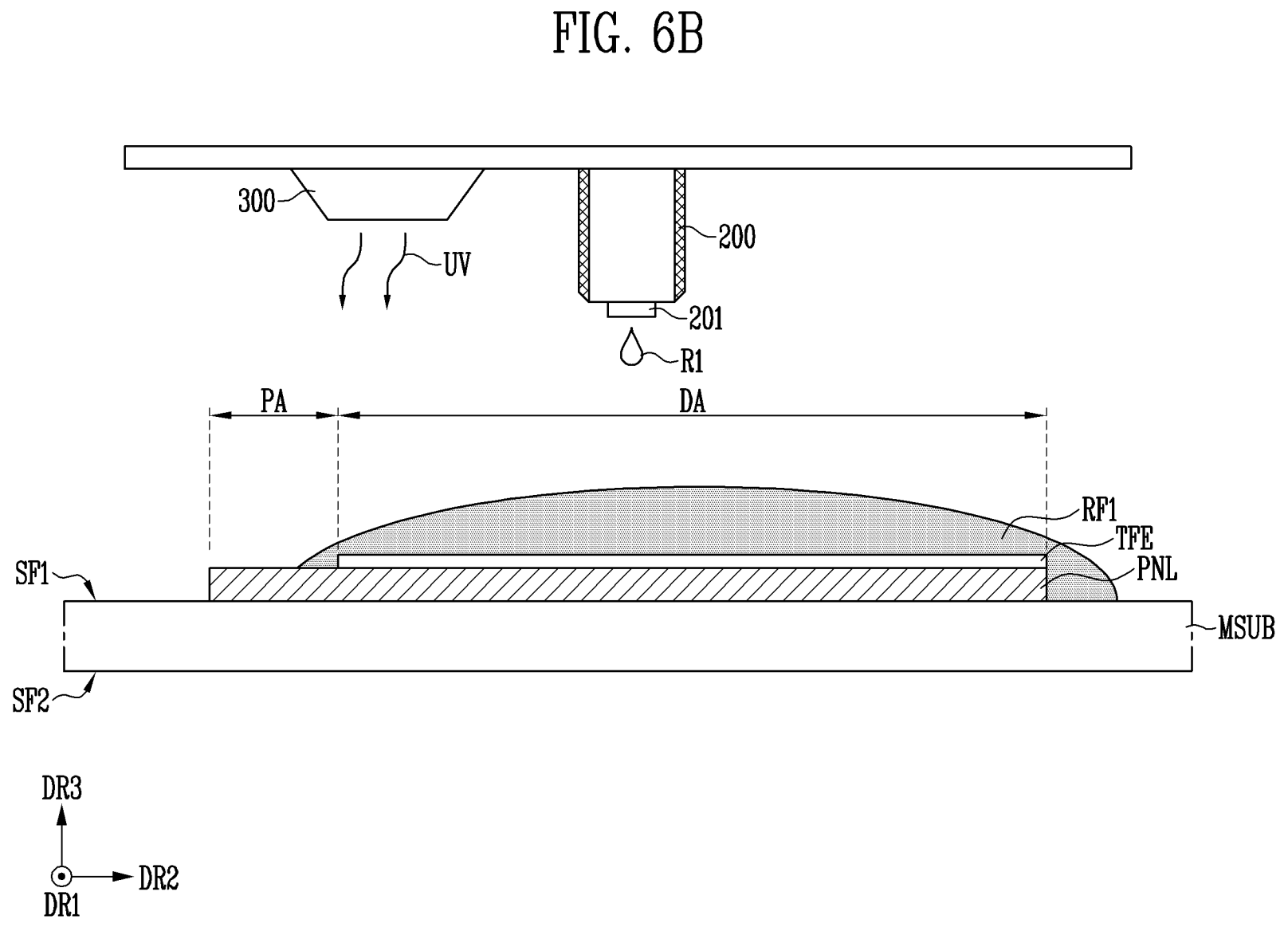

Referring to FIGS. 6A and 6B, the first protective layer RF1 covering the encapsulation layer TFE may be formed on the encapsulation layer TFE.

In an embodiment, the first protective layer RF1 may be formed by spraying a first resin material R1 on the encapsulation layer TFE by an inkjet printing method and curing the first resin material R1 with ultraviolet (UV) light.

The first resin material R1 may be discharged onto the encapsulation layer TFE through a nozzle 201 of an inkjet printing device 200. The first resin material R1 may be cured or dried by irradiating the first resin material R1 discharged onto the encapsulation layer TFE with the UV light using an UV lamp 300.

In an embodiment, a spray angle of the nozzle 201 of the inkjet printing device 200 may be about 45° to about 135°.

A thickness of the first protective layer RF1 may be about 100 μm, but the thickness is not limited thereto.

A process of spraying the first resin material R1 on the encapsulation layer TFE and a process of curing the first resin material R1 with the UV light may be performed simultaneously. Alternatively, after the process of spraying the first resin material R1 on the encapsulation layer TFE is completed, the process of curing the first resin material R1 with the UV light may be performed.

The first protective layer RF1 may have a first peeling force. The first peeling force of the first protective layer RF1 may be a physical property value indicating the amount of force required when the first protective layer RF1 is peeled from an adhesive.

The peeling force may vary depending on the type of resin material and the degree of curing of the resin material. The degree of curing by irradiation of UV light may vary depending on the number of monomers constituting the resin material. For example, the greater the number of monomers constituting the resin material, the higher the peeling force. In addition, the higher the degree of curing of the resin material, the higher the peeling force.

That is, the first peeling force of the first protective layer RF1 may vary depending on the type of the first resin material R1, the degree of curing of the first resin material R1, or a combination thereof.

FIG. 6A shows a case in which the first protective layer RF1 completely covers the display panel PNL and the encapsulation layer TFE.

FIG. 6B shows a state in which the first protective layer RF1 completely covers the encapsulation layer TFE and the display panel PNL disposed in the display area DA, but the display panel PNL disposed in the peripheral area PA is exposed. In this case, foreign substances may be introduced through the display panel PNL exposed through the peripheral area PA, and the display panel PNL may be damaged due to scratches.

Figure 7:
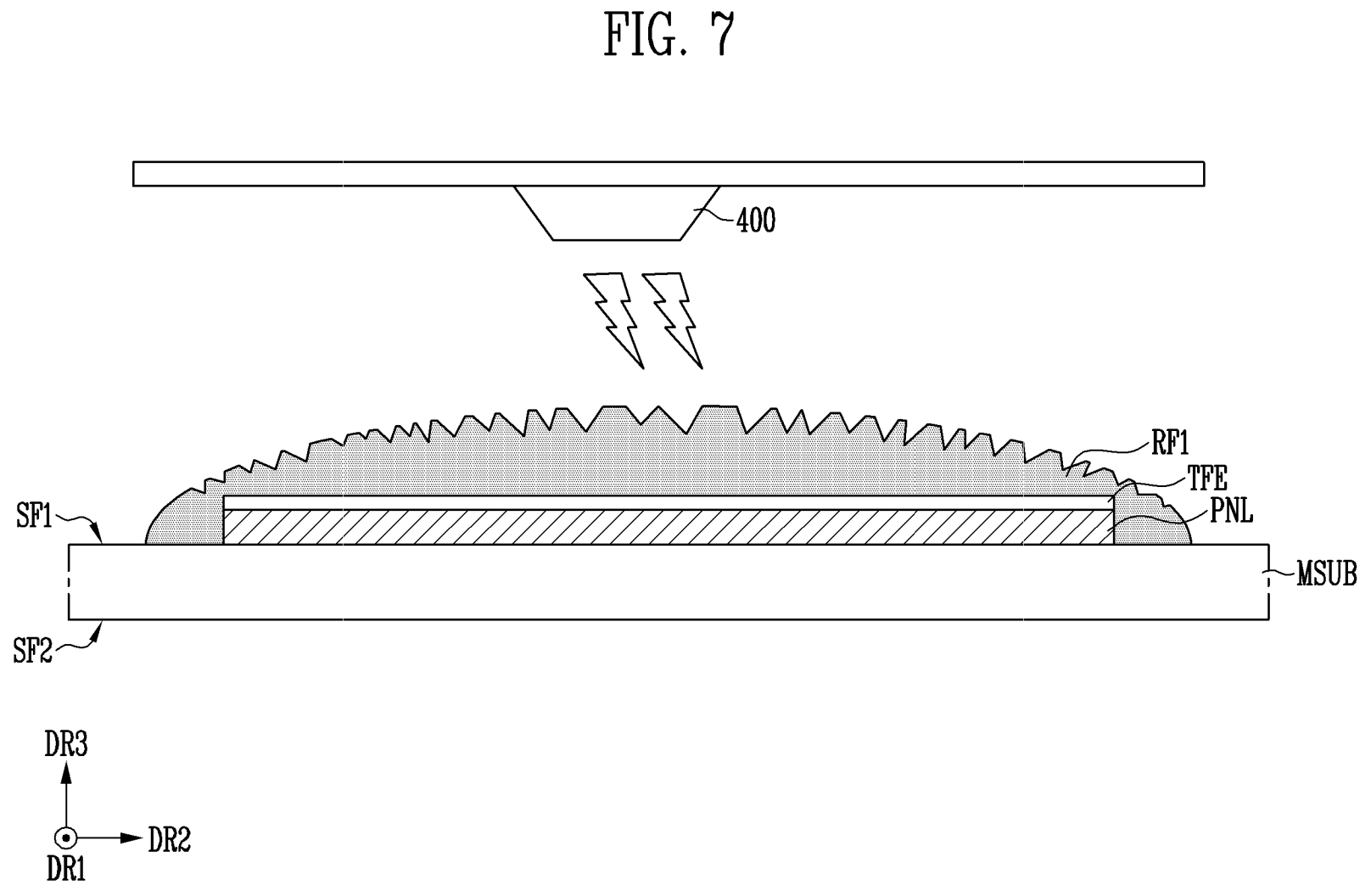

Referring to FIG. 7, plasma may be supplied to the first protective layer RF1. Thin film characteristics of the first protective layer RF1 may be improved by exposing the first protective layer RF1 to plasma using a plasma processing apparatus 400. Through the plasma surface treatment, adhesion between the first protective layer RF1 and the encapsulation layer TFE (and the second protective layer RF2 to be described later) may be improved. In one example, surface properties of the first protective layer RF1 may be changed through the plasma surface treatment. For example, by the plasma surface treatment, the contact angle of the first protective layer RF1 may be about 10° to about 15°.

Figure 8A:
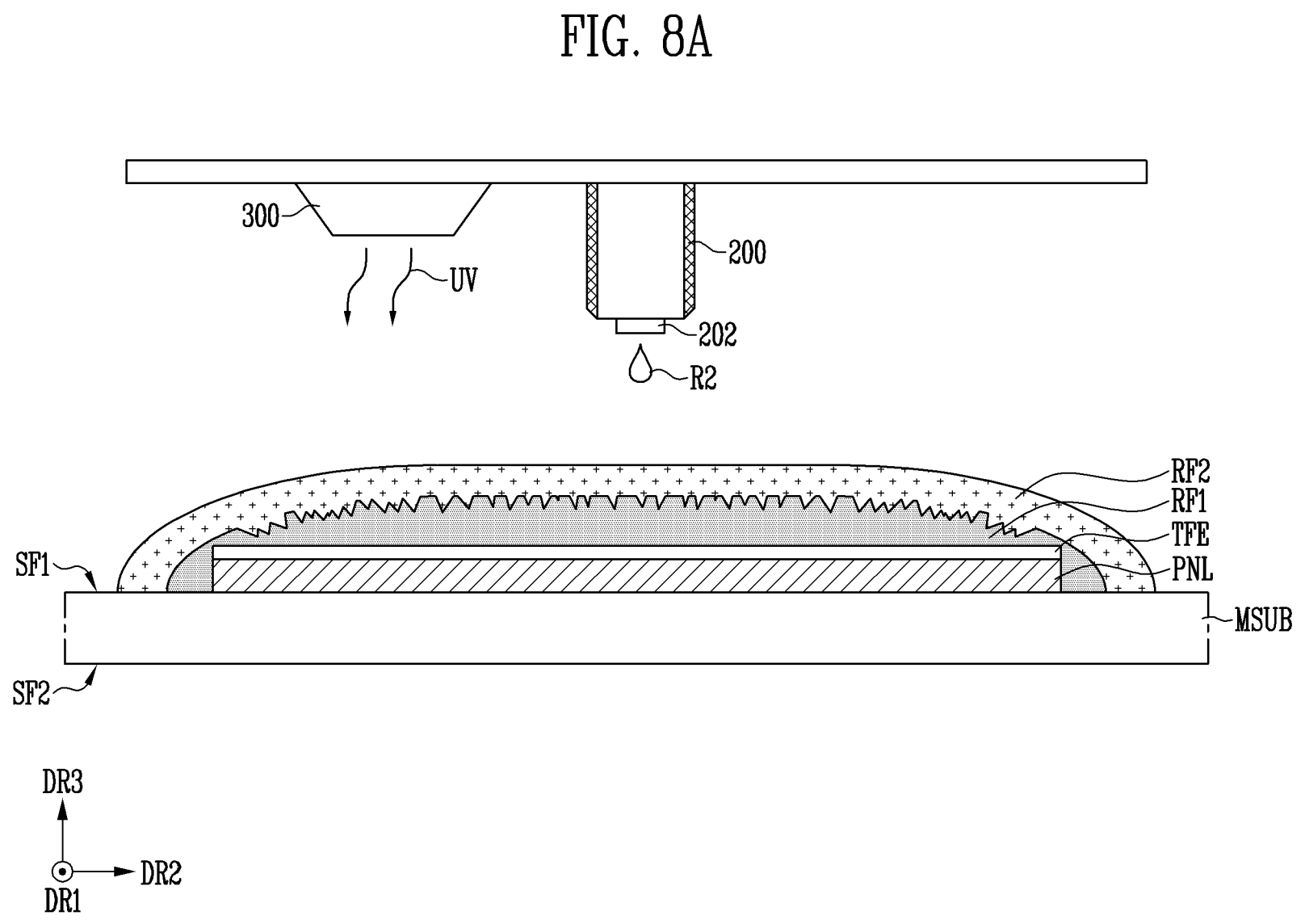
Figure 8B:
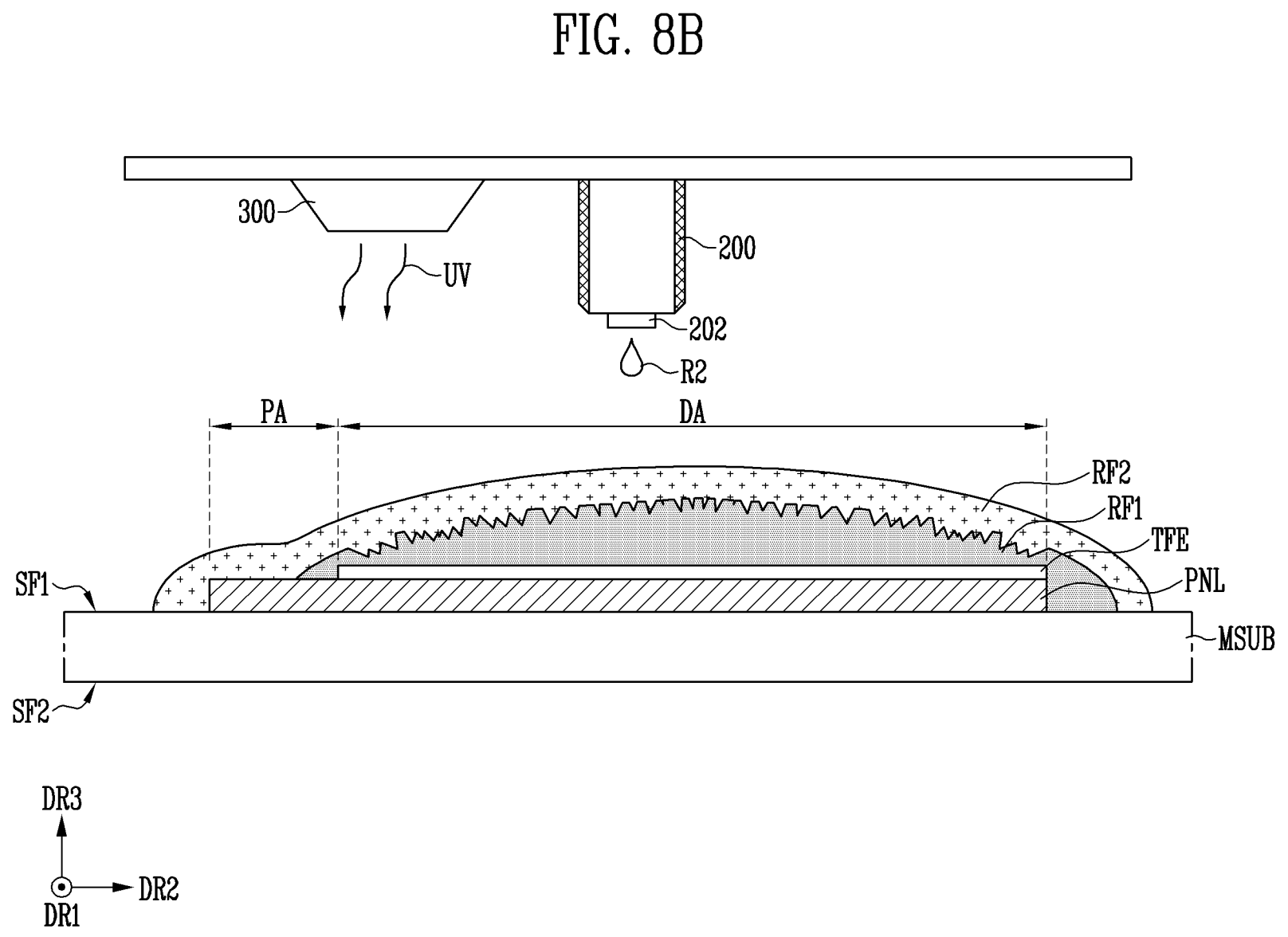

Referring to FIGS. 8A and 8B, the second protective layer RF2 covering the first protective layer RF1 may be formed on the first protective layer RF1.

In an embodiment, the second protective layer RF2 may be disposed on an entire surface of the display substrate DP. In one example, the second protective layer RF2 may be disposed on an entire surface of the display area DA and the peripheral area PA. In one example, the second protective layer RF2 may be disposed on an entire surface of the base substrate (for example, the base substrate 11 of FIG. 1). The second protective layer RF2 may be formed to cover an array area (for example, the array area AA of FIG. 1) and an outer area (for example, the outer area SA of FIG. 1) of the base substrate 11. In another example, the second protective layer RF2 may be formed on each display substrate DP of the base substrate 11.

In an embodiment, the second protective layer RF2 may be formed by spraying a second resin material R2 on the first protective layer RF1 by an inkjet printing method and curing the second resin material R2 with UV light.

The second resin material R2 may be discharged onto the first protective layer RF1 through a nozzle 202 of the inkjet printing device 200. The second resin material R2 may be cured or dried by irradiating the second resin material R2 discharged onto the first protective layer RF1 with the UV light using the UV lamp 300. In one example, the second resin material R2 may be exposed to the UV light for a second time period.

The second protective layer RF2 may include an UV curable resin material. The UV curable resin material may be cured by a chemical reaction when exposed to UV light.

In an embodiment, a spray angle of the nozzle 202 of the inkjet printing device 200 may be about 45° to about 135°.

A thickness of the second protective layer RF2 may be about 10 μm to about 30 μm, but the thickness is not limited thereto.

A process of spraying the second resin material R2 on the first protective layer RF1 and a process of curing the second resin material R2 with UV light may be performed simultaneously. Alternatively, after a process of spraying the second resin material R2 on the first protective layer RF1 is completed, a process of curing the second resin material R2 with the UV light may be performed.

The second protective layer RF2 may have a second peeling force different from the first peeling force of the first protective layer RF1. That is, the second peeling force of the second protective layer RF2 may be a physical property value indicating the amount of force required when the second protective layer RF2 is peeled from an adhesive. In one example, the second peeling force may be smaller than the first peeling force. In this case, since the first peeling force of the first protective layer RF1 is greater than the first peeling force of the second protective layer RF2, the amount of force required to peel the first protective layer RF1 from the adhesive may be greater than the amount of force required to peel the second protective layer RF2 from the adhesive.

In an embodiment, the first protective layer RF1 and the second protective layer RF2 may include an UV curable resin material. In one example, the UV curable resin material may include a compound that can be cured by UV light.

Referring to FIGS. 6A, 6B, 8A, and 8B, the first protective layer RF1 and the second protective layer RF2 may include the same UV curable resin material.

In an embodiment, the first protective layer RF1 may have the first peeling force, and the second protective layer RF2 may have the second peeling force different from the first peeling force.

The first resin material R1 constituting the first protective layer RF1 may be exposed to UV light for a first time period, and the second resin material R2 constituting the second protective layer RF2 may be exposed to UV light for the second time period shorter than the first time period. Since the first resin material R1 is exposed to the UV light for a long time than the second resin material R2, the degree of curing may be greater. In this case, the first peeling force of the first protective layer RF1 may be greater than the second peeling force of the second protective layer RF2.

Referring to FIGS. 6A, 6B, 8A, and 8B, the first protective layer RF1 and the second protective layer RF2 may include different UV curable resin materials.

The UV curable resin material may include monomers, oligomers, or a combination thereof. The first protective layer RF1 may have a higher weight average molecular weight than the second protective layer RF2. For example, the first protective layer RF1 may include more oligomers than the second protective layer RF2. The smaller the weight average molecular weight, the lower the density after UV curing, and thus the peeling force may decrease. Therefore, since the weight average molecular weight of the first protective layer RF1 is greater than the weight average molecular weight of the second protective layer RF2, the peeling force of the first protective layer RF1 may be greater than the peeling force of the second protective layer RF2.

Referring to FIG. 8B, the second protective layer RF2 may completely cover the first protective layer RF1 and the display panel PNL. In one example, the second protective layer RF2 may completely cover the display panel PNL and the first protective layer RF1 disposed in the peripheral area PA. Accordingly, the second protective layer RF2 may prevent foreign substances from entering through the display panel PNL exposed through the peripheral area PA, and prevent the display panel PNL from being damaged by an external force.

Figure 9:
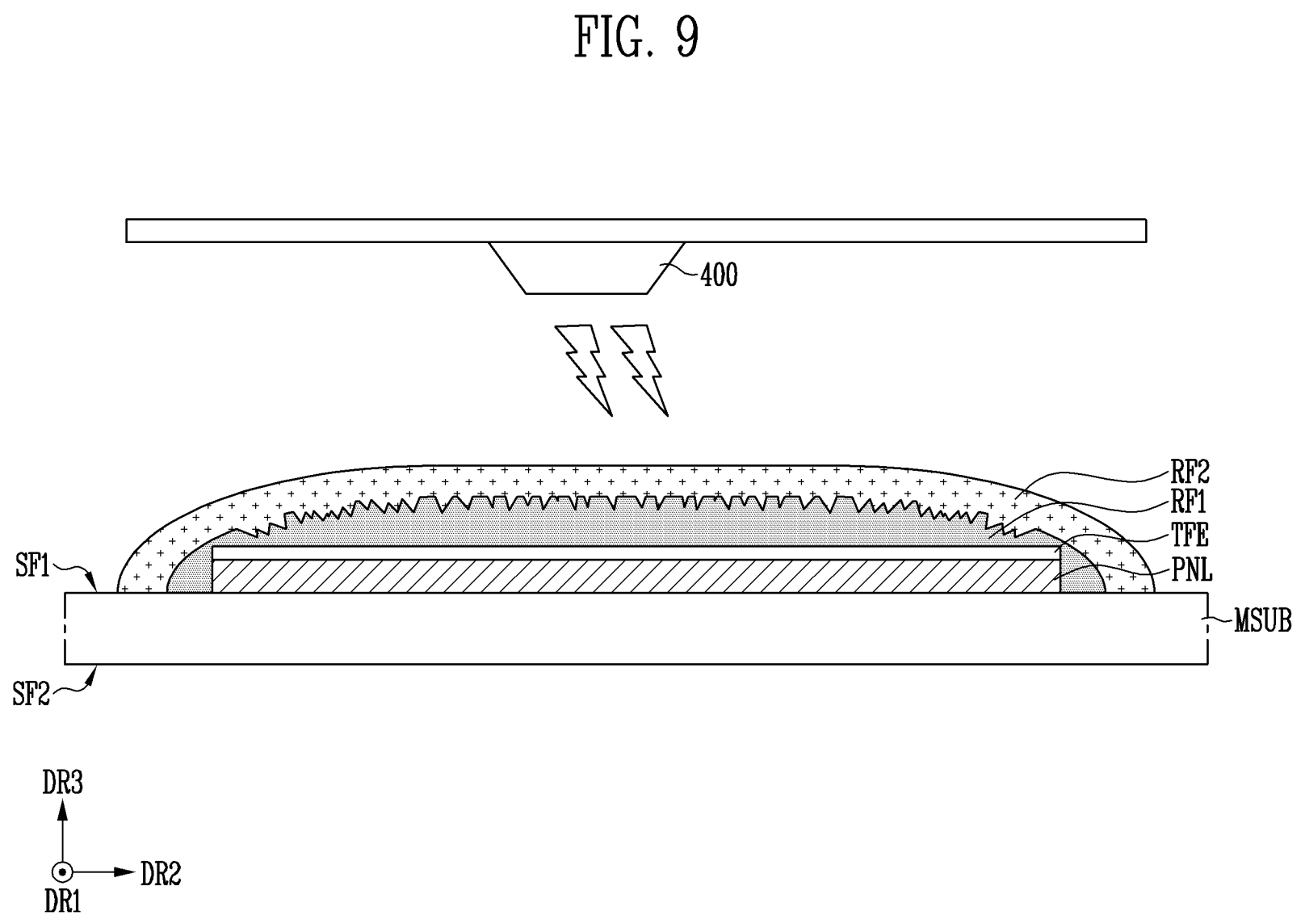

Referring to FIG. 9, plasma may be supplied to the second protective layer RF2. Thin film characteristics of the second protective layer RF2 may be improved by exposing the second protective layer RF2 to plasma using the plasma processing apparatus 400.

Figure 10:
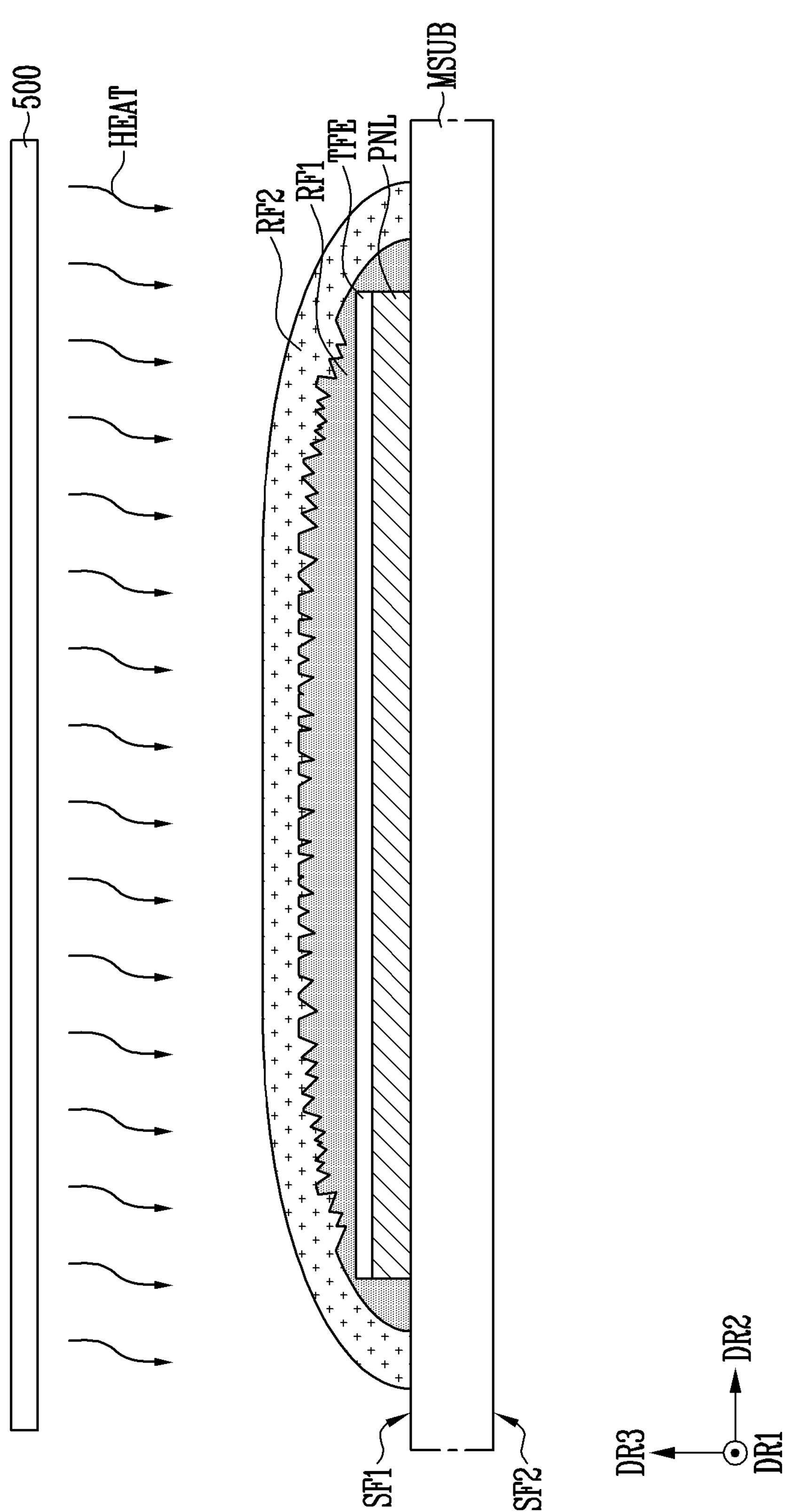

Referring to FIG. 10, heat may be supplied to the second protective layer RF2. The second protective layer RF2 may be cured by exposing the second protective layer RF2 to heat using a heating device 500.

Referring to FIGS. 9 and 10, within a range in which the second protective layer RF2 has the second peeling force lower than the first peeling force of the first protective layer RF1, the surface of the second protective layer RF2 may optionally be plasma treated, heat treated, or a combination thereof. Therefore, the plasma treatment process shown in FIG. 9 or the heat treatment process shown in FIG. 10 may be omitted depending on process conditions.

In an embodiment, the first and second protective layers RF1 and RF2 may protect the encapsulation layer TFE and the display panel PNL.

Referring to FIG. 11, the first film ARF may be formed on the first surface SF1 of the substrate MSUB. The first film ARF may be entirely coated on the first surface SF1 of the substrate MSUB.

In an embodiment, the first film ARF may be disposed on an entire surface of the substrate SUB through an adhesive ADL. The adhesive ADL may be formed to completely cover the first surface SF1 of the substrate SUB. In one example, the adhesive ADL may be formed on the second protective layer RF2 to completely enclose the second protective layer RF2. The adhesive ADL may include at least one of an optical clear adhesive (OCA), a pressure sensitive adhesive (PSA), a heat reaction adhesive, a general adhesive, or a double-sided tape.

In an embodiment, the first film ARF may be directly formed on the adhesive ADL. In one example, the first film ARF may completely cover the first surface SF1 of the substrate SUB.

In an embodiment, the first film ARF may include an acid-resistant film. The first film ARF may be formed of an acid-resistant material that does not react with an etchant described later. That is, the first film ARF may prevent the etchant from contacting the first surface SF1 of the substrate SUB. That is, the first film ARF may prevented the etchant from contacting the first and second protective layers RF1 and RF2 and display elements (for example, the encapsulation layer TFE and the display panel PNL) disposed on the first surface SF1. In one example, the first film ARF may include a polyethylene terephthalate (PET) film.

In an embodiment, the first film ARF may have a third peeling force. The third peeling force may be smaller than the second peeling force of the second protective layer RF2. That is, the force for peeling the first film ARF may be smaller than the force for peeling the second protective layer RF2.

Referring to FIG. 12, the second surface SF2 of the substrate MSUB may be removed. In a state where the first film ARF is attached on the first surface SF1 of the substrate MSUB, a slimming process may be performed on the substrate MSUB by a physical/chemical process such as etching. The slimming process may include a wet etching process using an etchant. The etchant may include hydrofluoric acid or a hydrofluoric acid-based material. For example, the wet etching process may include a dipping method, a spray method, or a top-down glass etching method. The dipping method may be a method of vertically dipping the substrate MSUB in a bath and etching the substrate MSUB. The spray method may be a method of etching the second surface SF2 of the substrate MSUB by spraying an etchant to one side of the substrate MSUB standing vertically at a predetermined spray pressure using a plurality of spray nozzles. The top-down glass etching method may be a method of etching the second surface SF2 of the substrate MSUB by allowing an etchant to flow down from an upper side of the substrate MSUB standing vertically.

Referring to FIGS. 5 and 12, the second surface SF2 of the substrate MSUB may be removed by the slimming process. The substrate SUB may include a substrate from which the second surface SF2 of the substrate MSUB is removed. A thickness H of the substrate MSUB may be reduced to a thickness H' of the substrate SUB. For example, the thickness of the substrate MSUB may be about 500 μm, and the thickness of the substrate SUB according to the slimming process may be about 200 μm.

Referring to FIG. 13, after the slimming process is completed, the second protective layer RF2 and the first film ARF may be removed.

In an embodiment, the second protective layer RF2 and the first film ARF may be simultaneously removed. Since the second protective layer RF2 is formed between the first film ARF and the first protective layer RF1, the first film ARF may be removed together with the second protective layer RF2 in a process of removing the first film ARF. Therefore, it is possible to prevent the first protective layer RF1 from being removed together with the first film ARF. That is, in the process of removing the first film ARF, the function of the first protective layer RF1 may be maintained, so that the encapsulation layer TFE and the display panel PNL can be protected.

Referring to FIGS. 5A and 13, the substrate SUB may include a first surface SF1 and a second surface SF2'. In one example, thicknesses of the first and second surfaces SF1 and SF2' of the substrate SUB may be smaller than thicknesses of the first and second surfaces SF1 and SF2 of the substrate MSUB.

The first protective layer RF1 may protect the encapsulation layer TFE and the display panel PNL on the substrate SUB from manufacturing processes performed after the first film ARF is removed. In one example, after the process of removing the first film ARF, a process of washing and drying the substrate SUB may be performed to remove remaining etchant. In addition, after the process of removing the first film ARF, a process of forming one display substrate DP may be performed through a cutting process of cutting the base substrate (for example, the base substrate 11 of FIG. 1) in units of array areas AA.

Figure 14:
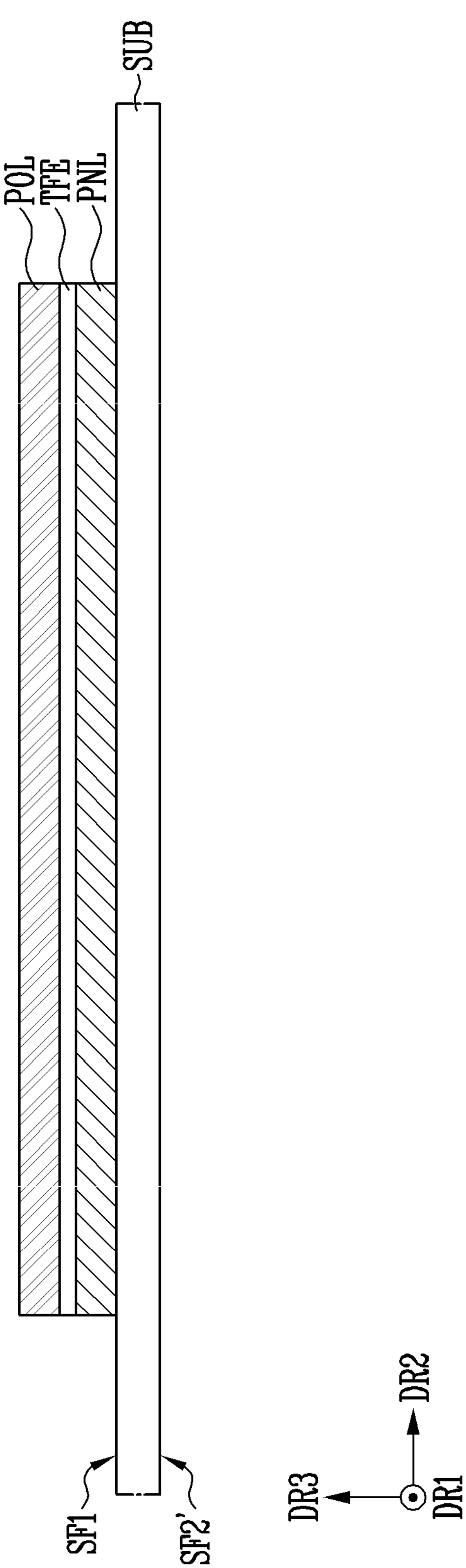

Referring to FIG. 14, the first protective layer RF1 may be removed before a module process of the display substrate DP may be performed. After the first protective layer RF1 is removed, the polarizing plate POL may be formed on the encapsulation layer TFE. In one example, the polarizing plate POL may include a polarizing film. In another example, the display substrate DP may include a color filter (not shown) instead of the polarizing plate POL. The color filter may have the same or similar function as the polarizing plate POL. In an embodiment, a window layer (not shown) may be additionally disposed on the polarizing plate POL.

According to the method of manufacturing the display device according to the embodiments, the second protective layer RF2 having a peeling force different from that of the first protective layer RF1 may be disposed between the first protective layer RF1 disposed on the display elements (for example, the encapsulation layer TFE and the display panel PNL) of the display device and the acid-resistant film (for example, the first film ARF) disposed on the entire surface of the substrate SUB. Therefore, it is possible to prevent the first protective layer RF1 from being removed together with the acid-resistant film in a process of peeling the acid-resistant film.

Also, since the second protective layer RF2 covers an outer area (for example, the peripheral area PA) of the display device, damage to the outer area of the display device may be prevented during a manufacturing process of the display device.

In a process of manufacturing the display device, stability of the process of manufacturing the display device can be secured by securing durability of a film for protecting the display elements in a process of etching the substrate SUB.

Although embodiments of the present inventive concepts have been described, various modifications and similar arrangements of such embodiments will be apparent to a person of ordinary skill in the art. Accordingly, the inventive concepts are not limited to such embodiments, but rather to the scope and spirit of the appended claims.

What is claimed is:

1. A method of manufacturing a display device comprising:

sequentially forming a display panel and an encapsulation layer on a first surface of a substrate;

forming a first protective layer covering the encapsulation layer;

forming a second protective layer covering the first protective layer;

forming a first film on the first surface of the substrate;

removing a second surface of the substrate facing the first surface;

removing the first film and the second protective layer; and after the removing the first film and the second protective layer, removing the first protective layer.

2. The method of claim 1, wherein the forming the first protective layer includes:

spraying a first resin material through a nozzle of an inkjet printing device;

curing the first resin material with ultraviolet light; and supplying plasma to the first resin material.

3. The method of claim 2, wherein the forming the second protective layer includes:

spraying a second resin material through the nozzle of the inkjet printing device; and curing the second resin material with ultraviolet light.

4. The method of claim 3, wherein the first protective layer has a first peeling force, and the second protective layer has a second peeling force different from the first peeling force, and wherein the first peeling force is greater than the second peeling force.

5. The method of claim 4, wherein the first film has a third peeling force smaller than the second peeling force.

6. The method of claim 4, wherein the first resin material and the second resin material include the same ultraviolet curable resin material, wherein in the curing the first resin material with the ultraviolet light, the first resin material is cured with the ultraviolet light for a first time period, and wherein in the curing the second resin material with the ultraviolet light, the second resin material is cured with the ultraviolet light for a second time period shorter than the first time period.

7. The method of claim 4, wherein the first resin material and the second resin material include an ultraviolet curable resin, wherein the ultraviolet curable resin includes a plurality of monomers and oligomers, and wherein the number of oligomers included in the first resin material is greater than the number of oligomers included in the second resin material.

8. The method of claim 3, wherein the forming the second protective layer further includes:

supplying plasma to the second resin material.

9. The method of claim 3, wherein a spray angle of the nozzle of the inkjet printing device is about 45° to 135°.

10. The method of claim 3, wherein the spraying the first resin material and the curing the first resin material with the ultraviolet light are performed simultaneously, and wherein the spraying the second resin material and the curing the second resin material with the ultraviolet light are performed simultaneously.

11. The method of claim 1, wherein in the removing the second surface of the substrate, the substrate is etched using an etchant.

12. The method of claim 11, wherein a thickness of the substrate including the first surface and the second surface is about 500 μm, and wherein the thickness of the substrate from which the second surface is removed is about 200 μm.

13. The method of claim 1, wherein the first film is an acid-resistant film.

14. The method of claim 13, wherein the first film includes a PET (polyethylene terephthalate) film.

15. The method of claim 1, wherein a thickness of the first protective layer is about 100 μm, and wherein a thickness of the second protective layer is about 10 μm to 30 μm.

16. The method of claim 1, further comprising:

disposing an adhesive layer covering the first surface of the substrate and the second protective layer, wherein in the forming the first film, the first film is formed on the adhesive layer.

17. The method of claim 1, wherein the second protective layer is removed simultaneously with the first film.

18. The method of claim 17, further comprising:

disposing a polarizing plate on the encapsulation layer, wherein the first protective layer is removed before the polarizing plate is disposed.

19. The method of claim 1, wherein the first surface of the substrate includes a display area and a peripheral area located on at least one side of the display area, and wherein at least a portion of the peripheral area is not covered by the first protective layer.

20. The method of claim 19, wherein the second protective layer entirely covers the display area and the peripheral area.

* * * * *